United States Patent [19]

Foster

[11] 3,813,761

[45] June 4, 1974

[54] SEMICONDUCTOR DEVICES

[75] Inventor: Alan Foster, Stockport, England

[73] Assignee: U. S. Philips Corporation, New York, N.Y.

[22] Filed: Feb. 29, 1972

[21] Appl. No.: 230,265

[30] Foreign Application Priority Data

Mar. 1, 1971 Great Britain .................... 5712/71

[52] U.S. Cl. ...................... 29/583, 29/578, 29/589

[51] Int. Cl. ........................................ B01j 17/00

[58] Field of Search ............ 29/580, 583, 589, 578, 29/576 S

[56] References Cited

UNITED STATES PATENTS

| | | | |
|---|---|---|---|
| 3,187,403 | 6/1965 | Ohntrup | 29/578 |
| 3,193,418 | 7/1965 | Cooper et al. | 29/578 |
| 3,374,533 | 3/1968 | Burks et al. | 29/588 |
| 3,590,478 | 5/1968 | Takehana | 29/578 |
| 3,716,911 | 2/1973 | Burtscher | 29/583 |

*Primary Examiner*—W. Tupman
*Attorney, Agent, or Firm*—Frank R. Trifari

[57] ABSTRACT

Method of producing semiconductor devices, comprising providing semiconductor body with a first major surface comprising mutually adjoining surface portions of substantially rectangular configuration; providing different conductivity type regions at various surface portions; providing metal electrode strips at the first major surface, the strips being substantially parallel to imaginary lines diagonally extending across respective surface portions, with strip portions interconnecting a number of the conductivity regions; and then dividing the semiconductor body along the orthogonal boundaries of the surface portions to produce the devices.

12 Claims, 7 Drawing Figures

SEMICONDUCTOR DEVICES

This invention relates to methods of manufacturing semiconductor devices comprising a wafer-shaped semiconductor element having substantially rectangular opposite major surfaces, at least two regions of different conductivity types extending at one of the major surfaces and contacted by two electrodes which extend at said one major surface on opposite sides of a diagonal line between oppositely located corners of the rectangular surface. The invention relates particularly, but not exclusively to methods of manufacturing bilateral gate controlled semiconductor devices.

In semiconductor device manufacture it is common practice to form simultaneously a plurality of device elements in a common wafer-shaped semiconductor body in the form of a large area slice by carrying out at one major surface of the body operations such as oxidation, etching, diffusion and contacting at a plurality of mutually adjoining rectangular portions of the surface and subsequently dividing the body along orthogonal boundaries of the rectangular surface portions to yield a plurality of individual device elements. The most common use of this method is in the manufacture of transistors and integrated circuits. Normally electrode connections at the one major surface to regions of different conductivity type are formed by separated parts of a commonly applied metal layer deposited after defining the regions by diffusion and defining openings in a surface insulating layer to expose parts of these regions. The definition of the openings in the insulating layer and of the separated parts of the commonly applied metal layer is usually carried out by photolithographic and etching methods. For a slice having a large plurality of device elements this involves critical mask alignment stages in the photolithographic methods.

Semiconductor devices suitable for full wave power control of an alternating current are known and comprise a semiconductor body having five successively arranged regions of alternating conductivity type extending between opposite major surfaces of the body and defining three p-n junctions therebetween. These devices normally have two main current carrying electrodes situated one at each major surface and a single gate electrode at one of the major surfaces and are known as TRIACS. The devices are bilateral and can exist in a conductive state in both directions of an alternating supply connected across the main current carrying electrodes. They can be triggered into the conductive state in either the first or third quadrants by application of a suitable potential to the gate electrode. In the most commonly occurring form of TRIAC triggering can be effected in the first and third quadrants with a voltage which is either positive or negative with respect to the voltage on the adjacently situated main current carrying electrode at the same major surface. Basically with respect to the shape of the semiconductor body two forms of commercial triac exist. In one of these the body is generally rectangular and the orientation of the outermost regions is with respect to the edges of the body as also is the orientation of the two electrodes at the one major side of the body. In the other form the body is in the form of a disc with a rather complex arrangement of the outermost regions and their relative overlap at opposite sides of the disc, the gate electrode being provided at the centre of one side of the disc and one of the main carrying electrodes being provided as an annulus surrounding the centre gate electrode. In the manufacture of these devices it is desirable for economic reasons to carry out operations such as oxidation, diffusion and contacting, to form a plurality of triac elements on a single slice and subsequently divide the slice. The disc form of body for each triac element can be used, the division of the slice into discs being by way of ultrasonic cutting. However this technique is best suited to relatively high current, large area devices as the number of disc-shaped triac elements that can be produced on one slice is limited. For relatively low current, small area devices the rectangular form of the semiconductor body is the obvious choice as the possibility exists of obtaining economically a large plurality of triac elements from a single slice of material. In manufacturing such rectangular triac elements on a single slice the application of the two electrodes at the one major surface is an operation in which large economies desirably could be made because the definition of openings, for example in a surface oxide layer and the definition of a subsequently evaporated electrode metal layer by photolithographic and etching methods is critical and requires critical mask alignment stages for the definition. Generally as the final electrode pattern becomes more complex the more critical is the alignment.

Similar considerations apply in other devices having two electrodes at one major surface, for example transistors and thyristors.

According to the invention there is provided a method of manufacturing a semiconductor device which comprises a wafer-shaped semiconductor element having substantially rectangular opposite major surfaces, at least two regions of different conductivity types extending at one of the major surfaces and contacted by two electrodes which extend at said one major surface on opposite sides of a diagonal line between oppositely located corners of the rectangular surface, wherein for forming a plurality of the device elements at a plurality of mutually adjoining rectangular surface portions at one major surface of a semiconductor body processing is carried out to form regions of different conductivity type extending at ach surface portion and subsequently electrode layers are provided at the major surface in the form of a plurality of substantially parallel extending metal layer strips which extend substantially parallel to one set of diagonal lines of the rectangular surface portions, each of said surface portions being contacted by two adjacently situated metal layer strip portions which extend on opposite sides of the diagonal line of the said surface portion, and after applying the electrode metal layer strips the semiconductor body including the applied electrodes is divided along orthogonal boundaries of the rectangular surface portions to yield a plurality of device elements each having at one major rectangular surface two substantially parallel extending electrodes situated at opposite sides of the diagonal line of the surface.

In this method large cost reductions can be made in manufacture because the provision of the electrodes to the plurality of rectangular surface portions at which a device element is present in the form of substantially parallel extending metal layer strips extending across the common semiconductor body can be effected in a relatively simple and cheap manner and advantageously can be carried out without the use of a photolithographic method as will be described hereinafter. Furthermore, by providing the substantially parallel metal layer strips extending substantially parallel to a diagonal line between oppositely located corners of the rectangular surface portion, this diagonal contacting method is particularly advantageous because the two diagonally extending electrode metal layer strip portions may be of larger surface area than would be the case when they have to be provided extending parallel to one of the sides of the rectangular surface portion. The larger surface area assists in the provision of further connections to the metal layer strip portions for example by thermocompression bonding wires thereto or by direct soldering of an intermediate comb member which provides connections between the metal layer strip portions and terminal posts of an envelope member in the form of a main comb. The diagonal contacting is advantageously employed when the rectangular surface portions are of square outline. Preferably the metal layer strips are all of the same width. Thus when the rectangular surface portions are of square outline the two electrode metal layer strip portions on each device element may be of the same area and may be symmetrically disposed with respect to the diagonal line. This may be advantageous in the manufacture of certain forms of triac as will be described hereinafter.

In a preferred form of the method the definition of the substantially parallel extending metal layer strips at the one major surface is achieved with the aid of a masking pattern applied at the one major surface by spraying wax through apertures in a metal mask applied at the one major surface. In such a form of the method large cost reductions may be made in manufacture because the use of a photolithographic method is not required. The technique of wax spraying through a metal mask can be employed because the electrode pattern in the form of a plurality of parallel extending strips is a very simple pattern and the metal mask required is a simple mask in that it only need comprise a plurality of parallel extending strip-like apertures which may have been formed by the relatively cheap technique of spark erosion. Furthermore due to the relatively simple form of the electrode pattern as a plurality of parallel extending strips the alignment of the metal mask may not be too critical.

The said preferred form in which wax spraying is employed to achieve the definition of the electrode layer strips may involve the application of the wax masking pattern in the form of strips to parts of an insulating layer formed on the one major surface, the remaining parts of the insulating layer subsequently being dissolved with a fluid which substantially does not attack the wax masking pattern, and subsequently the electrode metal layer strips are formed on the exposed parts of the semiconductor body surface. The metal layer strips may be formed by applying by evaporation deposition a metal layer over the whole surface including the exposed parts of the semiconductor body surface and the wax masking pattern and then dissolving the wax masking pattern and the overlying metal layer parts to leave only the electrode metal layer strips in contact with the exposed parts of the semiconductor body surface. Alternatively, after etching the unmasked insulating layer parts and then removing the wax masking pattern the electrode metal layer strips may be formed by electroless plating of the exposed strip parts of the semiconductor body surface.

In the method in accordance with the invention at each rectangular surface portion at least one diffusion step may be performed to obtain the regions of different conductivity type extending at the surface, the diffusion pattern at said surface having symmetry about the center point of each area (e.g., area ABCD). This symmetry of the diffusion pattern may be exploited when the two electrodes of the device element are interchangeable for example in certain forms of bilateral gate controlled devices to be described hereinafter, because the two electrodes can be provided having equal surface areas and also having symmetry with respect to the center point of each area. This permits the further manufacturing steps to be simplified with consequent cost reductions.

The method in accordance with the invention may be employed advantageously in the manufacture of a bilateral gate controlled semiconductor device having at the one rectangular major surface of the semiconductor element two electrode metal layer strip portions which constitute a main current carrying electrode and a gate electrode.

In one form of the method in which such a bilateral gate-controlled device is formed, the mutually adjoining rectangular surface portions at the one major surface of the body are of square outline and at each surface portion there are formed two diffused outermost surface zones of substantially equal areas which are symmetrically disposed with respect to the center point of each area of the surface portion, the electrode metal layer strips subsequently being applied extending substantially parallel to the said diagonal lines of the surface portions. Such a bilateral gate controlled semiconductor device is described in our co-pending British Pat. Application No. 5711/71 and the possibility exists of using either of the two electrodes at the one major surface as the gate electrode and the other electrode at the one major surface as the main current carrying electrode, the device having substantially the same characteristics for each of the two alternative circuit connections. The provision of diagonally oriented electrodes by the method in accordance with the invention in the form of portions of the metal layer strips provides for very large cost reductions to be made in manufacture. When the strips are of equal width and symmetrically disposed with respect to the diagonal lines the orientation of the device element after division of the semiconductor body is not critical, either of the two strip-form electrodes being available for contacting as the gate electrode and if desired the element can be contacted and encapsulated with similar terminals for the gate electrode and adjacent main current carrying electrode.

The said diffused outermost zones at the one major surface may be formed as a plurality of continuous diffused strip-like zones extending across the surface of the semiconductor body in parallel rows, the centre lines of the continuous strip-like zones corresponding to boundary lines of the rectangular surface portions. With this form of the diffused outermost zones the masking required for performing the diffusion is simplified because the technique of wax spraying through an apertured metal mask may be used to define a masking pattern of wax on an insulating layer on the one major surface, the unmasked areas of the insulating layer being removed and diffusion being effected into the thus exposed semiconductor surface parts. Due to the diffused zones being formed as strip-like regions extending in rows the apertured metal mask may be formed in a relatively simple manner by spark erosion and having a plurality of continuous apertures in rows. The metal mask used for defining the masking pattern for the diffusion may be slightly more complex than that used in defining the masking pattern for the application of the electrodes.

An embodiment of the invention will now be described, by way of example, with reference to the diagrammatic drawings accompanying the Provisional Specification, in which.

Figure 6:
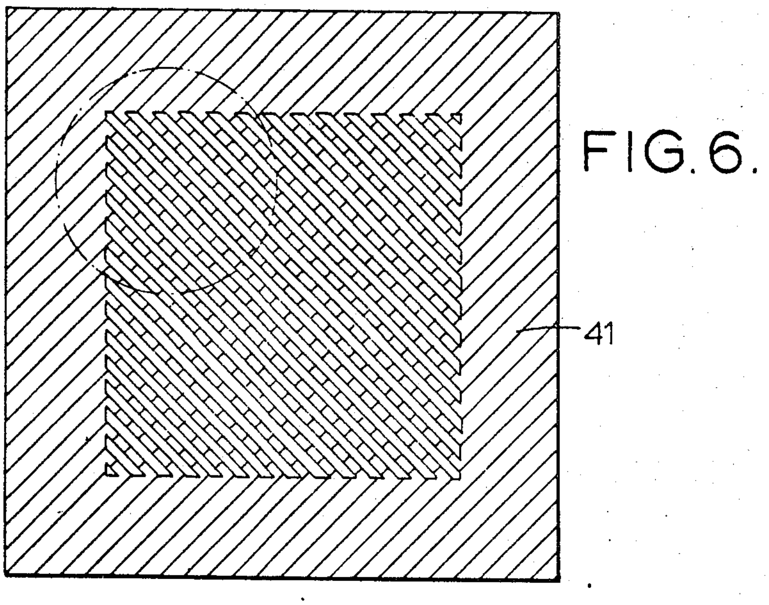
FIG. 6 is a plan view of a mask employed in the method in accordance with the invention.
Figure 7:
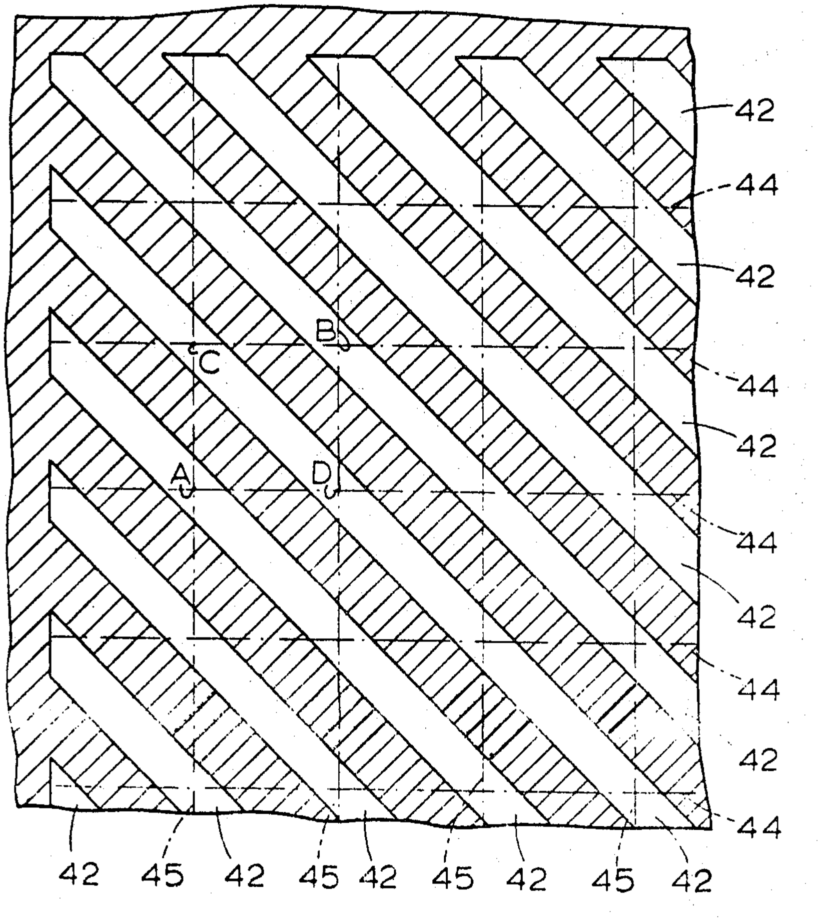
FIG. 7 is a detail plan view of part of the mask shown in FIG. 6.

Initially the bidirectional gate controlled semiconductor device will be described with reference to FIGS. 1 to 4 and thereafter its manufacture by a method in accordance with the invention will be described with reference to FIGS. 5 to 7.

The device shown in FIGS. 1 to 4 is a triac as described in our co-pending British Patent Application No. 5711/71 for use at 8 amps. (R.M.S.) or less and comprises a wafer-shaped semiconductor element of silicon of 2.5 mm. × 2.5 mm. × 230 microns thickness. The body has an inner n-type zone 21 (FIGS. 3 and 4) of 110 microns thickness, and diffused first and second outer p-type zones 22 and 23 respectively each of 60 microns thickness which extend respectively at the lower side and upper side of the silicon body and form p-n junctions $J_1$ and $J_2$ respectively with the inner n-type zone 21. A first outermost diffused n-type zone 24 of 15 microns thickness forms a p-n junction $J_3$ with the first outer p-type zone 22 and extends at the lower side of the body. Second and third outermost diffused n-type zones 25 and 26 form p-n junctions $J_4$ and $J_5$ respectively with the second outer p-type zone 23 and both extend at the upper side of the body.

The junctions $J_1$ and $J_2$ extend completely across the semiconductor body and terminate in the side surfaces. The junction $J_3$ terminates partly in the side surfaces and partly in the lower surface of the body, the latter termination being shown by the broken line referenced $J_3$ in FIG. 2. The junctions $J_4$ and $J_5$ terminate partly in the side surfaces and partly in the upper surface, the latter terminations being shown by the broken lines referenced $J_4$ and $J_5$ in FIG. 1.

Figure 1:
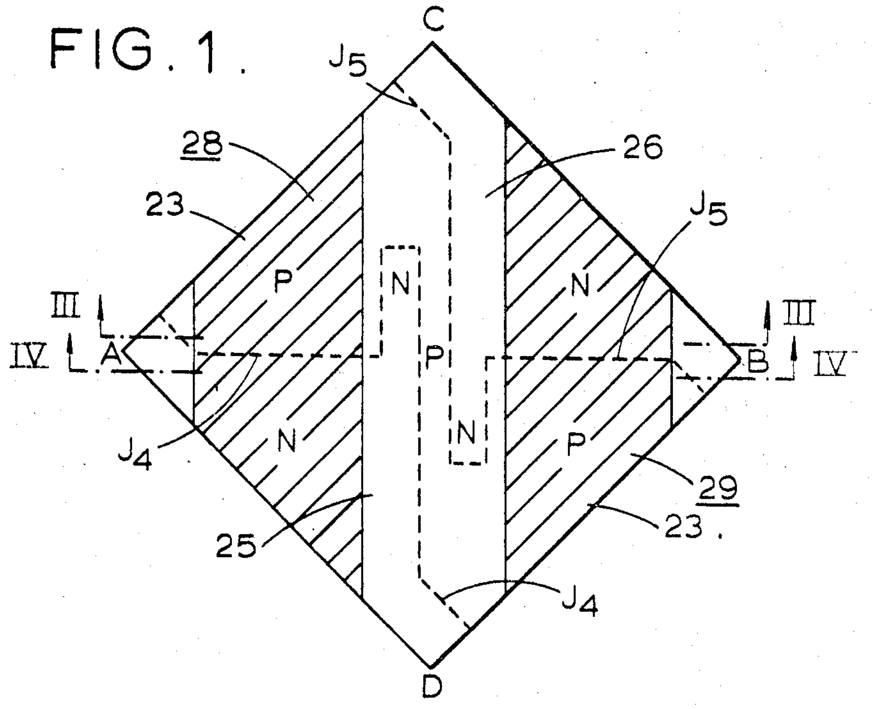
FIGS. 1 and 2 show the diffusion pattern and electrode layers at upper and lower opposite major sides respectively of a semiconductor element of a bidirectional gate controlled semiconductor device manufactured by a method in accordance with the invention.
Figure 2:
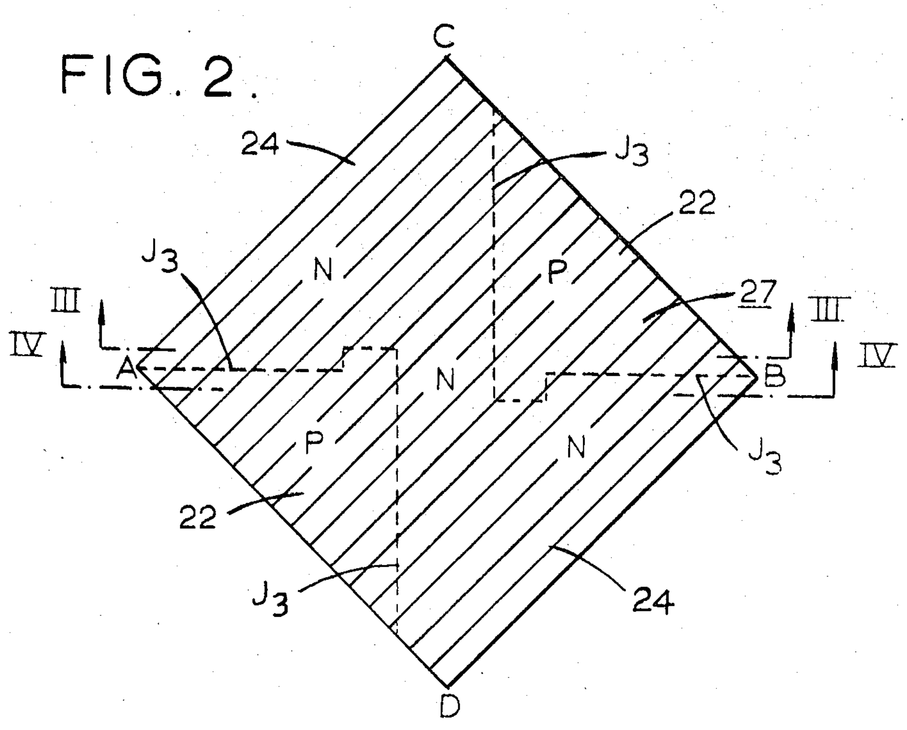
Figure 3:
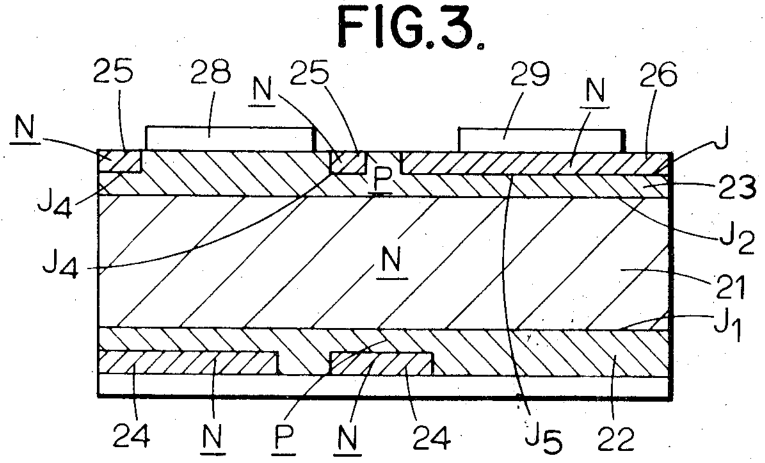
FIGS. 3 and 4 are vertical sectional views of the semiconductor element taken on the lines III—III and IV—IV respectively and shown both in FIGS. 1 and 2.
Figure 4:
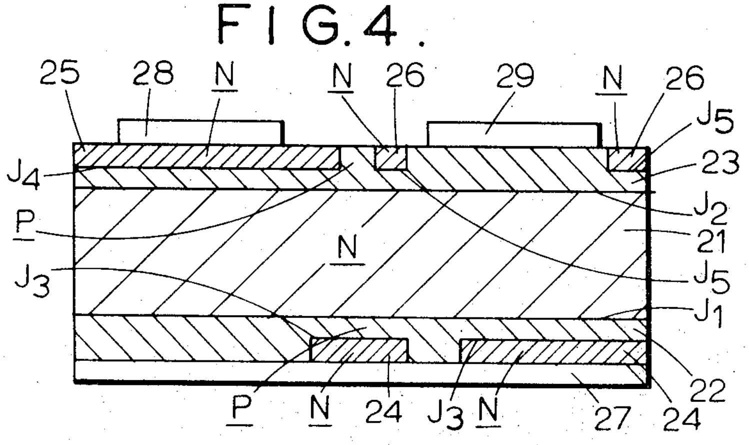

In FIGS. 1 and 2 the corners of the silicon element of square outline are shown by references A, B, C and D. Both FIGS. 1 and 2 represent a view looking down on the body from the upper side. Thus if FIG. 1 was displaced along the adjoining diagonal lines CD of FIGS. 1 and 2 until it was superimposed on FIG. 2 then this would represent a view of the body as seen from above.

On the lower side of the body there is a metal layer electrode 27, indicated by the hatched shading in FIG. 2, which extends completely across the silicon surface at the lower side and consists of a plated layer of nickel of between 2 and 3 microns thickness having thereon a plated gold layer of less than 1 micron thickness. The electrode 27 thus forms at the lower side of the silicon body a common ohmic contact to the first outer p-type zone 22 and the first outermost diffused n-type zone 24, the electrode 27 shorting the junction $J_3$ where it extends at the surface and constituting a first main current carrying electrode.

The second and third outermost diffused n-type zones 25 and 26 where they extend at the upper side of the body are symmetrically disposed with respect to the diagonal line CD between opposite corners of the surface. On the surface at the upper side there are two electrodes 28 and 29 each in the form of metal layer strips also of nickel (2–3 microns) having gold (< 1 micron) thereon. The strips are of 1.0 mm. width. These electrodes extend substantially parallel to the diagonal line CD. The metal layer strip electrode 28 forms a common ohmic contact at the upper side of the silicon body to the second outer p-type zone 23 and the second outermost diffused n-type zone 25, part of the junction $J_4$ where it terminates at the upper surface being shorted by the electrode 28. The metal layer strip electrode 29 forms a common ohmic contact at the upper side of the silicon body to the second outer p-type zone 23 and the third outermost diffused n-type zone 26, part of the junction $J_5$ where it terminates at the upper surface being shorted by the electrode 29. Electrodes 28 and 29 together constitute a second main current carrying electrode and a gate electrode and either of two alternative circuit connections for these electrodes is possible. Furthermore due to the particular situation of the n-type zones 25 and 26 of each surface area with respect to the n-type zone 24 and their symmetry about the diagonal line CD the device has substantially the same characteristics for both the two alternative circuit connections. For both of the two alternative circuit connections the device can be triggered from the non-conductive state to the conductive state in the first quadrant and in the third quadrant with positive or negative voltages on the gate electrode 28 or 29 with respect to the voltage on the main current carrying electrode 29 or 28 respectively. For a more detailed description of the device and the configuration of the various regions reference is invited to our copending British Pat. Application No. 5711/71.

The basic steps involved in the manufacture of a device element as shown in FIGS. 1 to 4 will now be described with reference to FIGS. 5 to 7. The starting material is, for example, a silicon slice in the form of a disc of n-type material having a resistivity of 25 ohm-cm., a diameter of 35 mm. and thickness of 0.35 mm. The slice is prepared to be optically flat on opposite major sides by lapping and etching prior to the first diffusion process. Diffusion of acceptor impurity is effected into opposite major surfaces of the slice to form the outer p-type zones 22 and 23 and the junctions $J_1$ and $J_2$ each of which is situated at a depth of approximately 60 microns from the adjacent surface.

By a process commonly employed in the semiconductor art, the disc is provided with an oxide layer on all surfaces. Masking layers are then applied on the oxide layer at opposite major sides of the disc, the layers having the pattern desired for obtaining, by diffusion of phosphorus into the exposed silicon portions formed by local removal of the oxide layers at the apertures in the masking layers, the outermost diffused n-type zones 24, 25 and 26 at a plurality of locations on the slice. The masking layers may be formed using a photoresist which is defined by a photoprocessing method using photomasks. However a preferred method employs the technique of wax spraying through apertures in metal mask plates provided on the surfaces. The formation of the masking pattern at the upper surface will be described in further detail hereinafter. The masking and subsequent phosphorus diffusion is carried out so that at each of a plurality of mutually adjoining portions of the slice of square surface area the n-type zones 24, 25 and 26 are formed. The junction depths of the n-type zones 24, 25 and 26 are approximately 15 microns in each case and the phosphorus surface concentration is approximately $10^{21}$ atoms/cm$^3$.

Due to the oxidation which occurs during the phosphorus diffusion step, at the upper surface and lower surface oxide layers cover these surfaces of the slice. A further masking pattern is then applied at the upper surface as follows. The slice is placed in a holder together with a metal mask 41 as shown in FIG. 6 on the oxide layer on the upper surface. This mask comprises a metal plate having a plurality of apertures in the form of strips 42 which have been formed by spark erosion. FIG. 7 shows in detail part of the mask, the remaining metal parts between the apertures 42 being shown cross-hatched. The orthogonal broken lines 44 and 45 shown in FIG. 7 define a plurality of mutually adjoining square portions of 2.5 mm × 2.5 mm., these portions corresponding in area to the square surface portions of the sites on the slice at which the diffusion of phosphorus has been carried out to form the n-type zones 24, 25 and 26. The metal mask 41 is aligned in the holder with respect to the slice so that the square portions on the mask corresponding substantially with the said sites on the slice. The apertures 42 extend parallel with diagonals of the square portions and for the square portion ABCD shown in FIG. 7 on opposite side of the diagonal CD there extends two strip parts 46 of the metal mask. The strip parts 46, each of 1 mm. width, are symmetrically disposed with respect to the diagonal line CD and these correspond in area and position to the electrode layers to be applied subsequently. A masking pattern of wax is applied on the surface of the oxide layer by spraying wax onto the mask 41. After removal of the mask the pattern consists of a plurality of diagonal strips of wax corresponding to the locations of the apertures 42. The unmasked areas of the oxide layer at the upper surface are then removed by etching with hydrofluoric acid. Simultaneously the oxide layer present on the opposite, lower surface is removed with the hydrofluoric acid. Thereafter the wax masking pattern at the upper side is removed. Electrode layers are then applied to the strip-form exposed silicon surface parts at the oxide masked upper surface and to the whole of the exposed lower surface by electroless plating first with nickel (2–3 microns) and then gold (< 1 micron). In this manner a plurality of parallel extending metal layer electrode strips are formed on the upper surface and a continuous electrode layer is formed on the lower surface.

Figure 5:
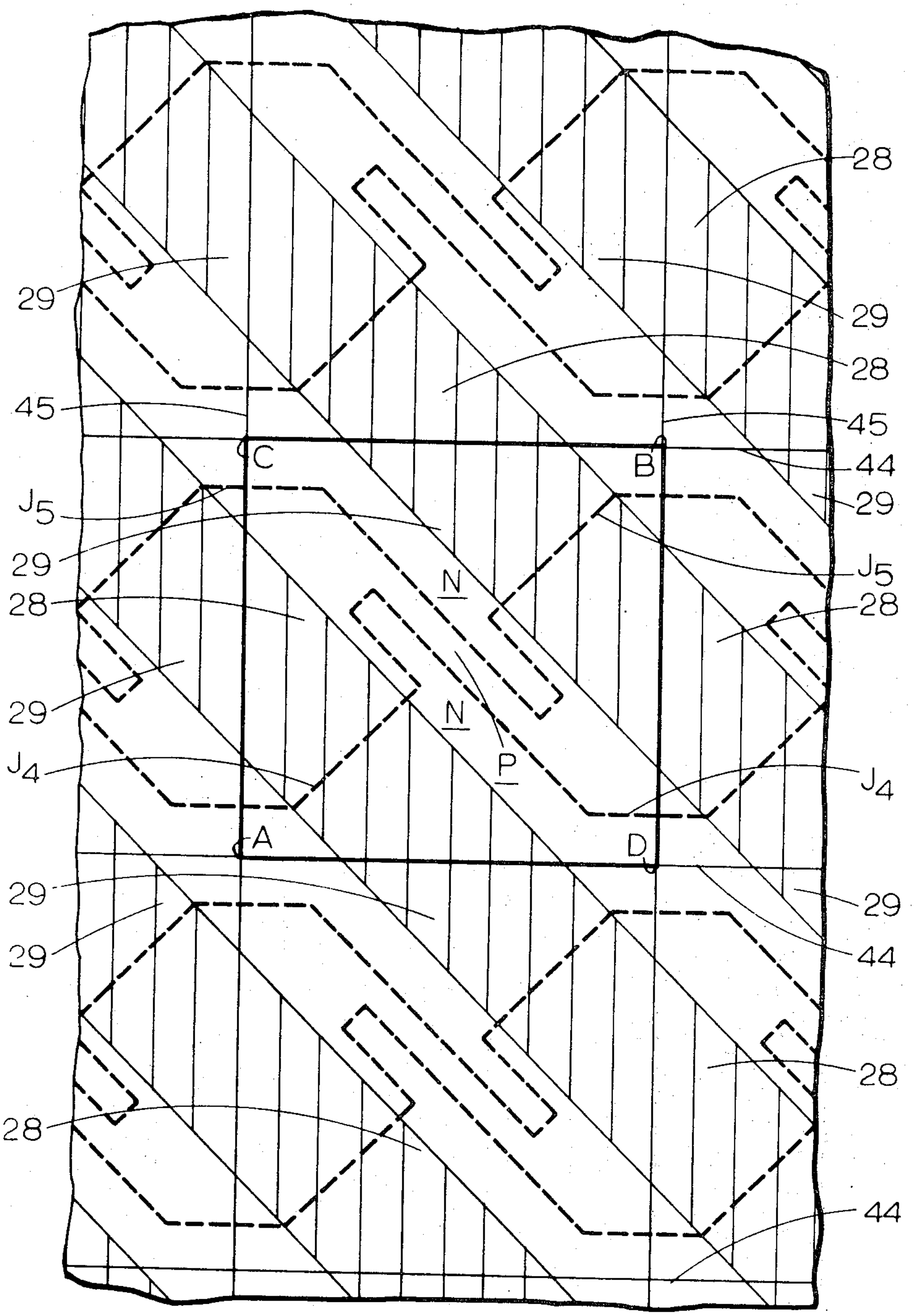
FIG. 5 is a plan view of part of the upper side of a silicon slice in which a plurality of the device elements as shown in FIGS. 1 to 4 are present, the Figure showing the slice at a stage in the method in accordance with the invention after application of the electrode metal layer strips and prior to division of the slice to yield the individual elements.

FIG. 5 of the accompanying drawings shows in plan view the upper side of part of the silicon body after forming the metal layer electrode strips. In the centre of the Figure there is shown a device of square surface area having diagonals A–B and C–D as is shown in FIGS. 1 and 2 and having electrodes 28 and 29 shown cross-hatched. The horizontal lines 44 and vertical lines 45 represent the location of cutting lines subsequently to be made with a sawing tool. From the Figure it is seen that the electrodes 28 and 29 in the centre device form part of continuous strips which extend parallel to the diagonal C–D. The strip from which electrode 28 of the centre device is formed also provides electrode 29 in the device immediately below the centre device and the electrode 28 in the device situated immediately to the right of the latter. The strip from which electrode 29 of the centre device is formed also provides electrode 28 of the device immediately above the centre device and electrode 28 of the device immediately on the right of the centre device. From FIG. 5 the form of the diffusion pattern of the n-type zones 25 and 26 over adjoining parts of the slice can be seen. Junctions $J_4$ and $J_5$ both terminate in the two sides A–C and B–D of each site. Thus with this form of the termination of the junctions continuity of the n-type zones 25 and 26 of vertically adjoining sites exists and thus the outer p-type zones 23 of horizontally adjoining sites are continuous. These p-type zones 23 thus extend in strip-form rows across the slice as also do the n-type zones 25 and 26. This leads to a certain simplification in the masking required when forming the n-type zones 25 and 26 by diffusion of phosphorus into exposed surface parts of the slice formed by selectively etching the oxide layer at the upper side. The metal mask used comprises a plurality of strip-form apertures corresponding in size and position to the p-type zone 23 which is to remain. The apertures through which wax is sprayed extend in rows parallel to the lines 44 and due to the continuity of the p-type zone 23 which is to remain, the apertures in the mask in each row also are continuous. This enables the metal mask to be formed relatively cheaply by spark erosion.

After forming the electrode layers the slice is divided along the lines 44 and 45 by sawing. Thereafter each device element A–B, C–D obtained is subjected to an etching treatment to remove any damage from the side surfaces which occurs due to sawing. Finally each device element is mounted on a suitable header member and electrode connections made by a process commonly used in the semiconductor art.

The method in accordance with the invention may be used in the manufacture of other devices having two electrodes situated at one major surface, for example transistors and thyristors.

What we claim is:

1. A method of manufacturing a plurality of semiconductor devices individually including a wafer shaped semiconductor element having opposite major surfaces of substantially rectangular configuration, at least two regions of different conductivity types disposed at a first said major surface, and two spaced electrodes disposed at said first major surface on opposite sides of a diagonal line extending between opposite corners of said first major surface, said electrodes individually contacting at least one of said regions of different conductivity types, said method comprising the steps of:

a. providing a semiconductor body comprising a first major surface comprising mutually adjoining surface portions of substantially rectangular configuration;
b. providing at said surface portions respective regions of different conductivity type;
c. providing at said first major surface electrode means comprising a plurality of spaced metal strips disposed substantially parallel to imaginary lines extending diagonally across respective ones of said surface portions, paired ones of said metal strips being disposed, at respective said surface portions and at least one metal strip of each pair being connected to said different conductivity type regions of said surface portion associated therewith; and then
d. dividing said semiconductor body carrying said metal strips, along the orthogonal boundaries of various ones of said surface portions, thereby providing a plurality of said semiconductor devices.

2. A method as recited in claim 1, wherein said surface portions are of square outline.

3. A method as recited in claim 1, wherein said metal strips are all of the same substantially uniform width.

4. A method as recited in claim 1, wherein said metal strips are produced by the steps of:

a. applying an apertured metal mask at said first major surface, said mask embodying the desired pattern of said metal strips;
b. spraying a wax material through said mask apertures and onto said first major surface, thereby producing at said first surface a masking pattern partially covering said first surface; and then,
c. depositing said metal at exposed portions of said first surface.

5. A method as recited in claim 4, further comprising the steps of:

a. forming an insulating layer on said first major surface before forming said wax masking pattern, said masking layer thereafter being disposed on first portions of said insulating layer; then
b. removing the other portions of said insulating layer uncovered by said wax pattern so as to expose parts of said first major surface, said removal being carried out with a fluid material to which said wax material is substantially completely resistant; and then
c. forming said metal strips on said exposed parts of said first major surface.

6. A method as recited in claim 5, wherein the metal layer strips are formed by electroless plating on said exposed parts of said first surface of said semiconductor body.

7. A method as recited in claim 1, wherein at least one diffusion step is performed at each rectangular surface portion to obtain said regions of different conductivity types located at said first surface, said diffused regions of each surface portion comprising a pattern having substantial symmetry about the center point of each said surface portion.

8. A method as recited in claim 1, wherein said semiconductor device is a gate controlled bidirectional semiconductor device and said parts of one of said pairs of metal strips are disposed at said first major surface of said semiconductor device, one of said strips being adapted to serve as a main current carrying electrode and the other of said strips being adapted to serve as a gate electrode.

9. A method as recited in claim 1, wherein said surface portions of said semiconductor body first major surface are of substantially square configuration and individually comprise two outer said regions diffused therein, said outer regions having areas substantially equal to each other and being symmetrically disposed with respect to the diagonal between opposite corners of respective ones of said surface portions.

10. A method as recited in claim 9, wherein said diffused outer regions are produced by forming in said first major surface a plurality of parallel continuous diffused regions individually having a strip-like configuration and extending across said first major surface, the respective center lines of said diffused regions being substantially parallel to and disposed between one set of the boundary lines of respective said rectangular surface portions.

11. A method as recited in claim 10, wherein said continuous regions are produced by steps comprising applying an apertured metal mask at said first major surface, spraying a wax material through said mask apertures onto said first major surface, removing said metal mask and then forming said regions at the uncovered parts of said first surface.

12. A method as recited in claim 11, wherein an insulating layer is located on said first major surface and said wax material is deposited on said insulating layer as a pattern of parallel rows of strip like regions extending across said insulating layer, removing portions of said insulating layer uncovered by said wax pattern by means of a fluid to which said wax material is substantially completely resistant, and producing said diffused regions at exposed parts of said first surface.

* * * * *